United States Patent [19]

Kresge et al.

[11] Patent Number: 4,803,436
[45] Date of Patent: Feb. 7, 1989

[54] METHOD AND APPARATUS FOR EVALUATING THE CONDITION OF A GAPLESS METAL-OXIDE VARISTOR LIGHTNING ARRESTER USED FOR PROTECTING A DISTRIBUTION TRANSFORMER

[75] Inventors: James S. Kresge, Pittsfield; Gordon E. Zaks, Dalton, both of Mass.

[73] Assignee: General Electric Company, King of Prussia, Pa.

[21] Appl. No.: 97,028

[22] Filed: Sep. 16, 1987

[51] Int. Cl.$^4$ .............................................. G01R 31/02
[52] U.S. Cl. .................................... 324/549; 324/72
[58] Field of Search .................. 324/72, 547, 549, 551, 324/552, 553, 158 R, 158 D; 361/35, 38, 39, 40, 111, 127, 128, 129

[56] References Cited

U.S. PATENT DOCUMENTS 4,577,148  3/1986  Sweetana ............................ 324/72
4,621,298  11/1986 McMillen ............................ 361/38

OTHER PUBLICATIONS

Article Entitled "Zinc-Oxide and the Distribution System" Appearing in the Magazine *Electric Forum*, vol. 11, No. 1, 1985, pp. 22–28, Published by General Electric Company, Fairfield, CT.

*Primary Examiner*—Reinhard J. Eisenzopf
*Assistant Examiner*—Walter E. Snow
*Attorney, Agent, or Firm*—Henry J. Policinski; William Freedman

[57] ABSTRACT

For evaluating the condition of a first lightning arrester of the gapless metal-oxide varistor type that is connected across the high voltage winding of a transformer, I connect externally of the transformer a second arrester of the same type, but with means for selectively changing its breakdown voltage between a first value that is higher than the normal breakdown voltage of the first arrester and a second value that is lower than said normal breakdown voltage. Pulses are applied to the low voltage winding of the transformer while the second arrester has its breakdown voltage set at the first value and while said breakdown voltage is set at said second value. By determining whether or not the second arrester conducts in response to each of these pulses, it can be established whether the first arrester is then undamaged, damaged in a shorted mode, or damaged in an open mode.

8 Claims, 2 Drawing Sheets

METHOD AND APPARATUS FOR EVALUATING THE CONDITION OF A GAPLESS METAL-OXIDE VARISTOR LIGHTNING ARRESTER USED FOR PROTECTING A DISTRIBUTION TRANSFORMER

BACKGROUND

This invention relates to a method of evaluating the condition of a gapless metal-oxide varistor lightning arrester and, especially, though not exclusively, a lightning arrester of this type which is located within the housing of a distribution transformer. The invention also relates to apparatus for carrying out such a method.

In recent years, it has become increasingly common to locate the lightning arrester for a distribution transformer within the transformer tank, or housing, and thus under oil. This has been made possible by new designs of lightning arresters which employ metal-oxide varistors and have no gaps. Such arresters, which are referred to herein as gapless metal-oxide varistor type lightning arresters, are typically directly connected across the high voltage winding of the distribution transformer.

These arresters have typically been designed with a frangible end fitting so that in the rare event of an arrester failure, the failed arrester will be disconnected from the winding across which it is normally connected. The disconnection means is not designed as a fault-clearing device, but rather clearing is effected by a fuse or circuit breaker in the transformer supply circuit that opens in response to the fault.

Once an arrester has failed, the fault-clearing device has operated, and the arrester disconnection means has properly operated, the transformer can be reenergized for emergency use without arrester protection. It is possible that the arrester disconnection scheme may in some cases not properly operate and a faulted arrester will be left connected to the winding. In any case, when a lineman arrives to service the transformer it is desirable if he has a simple means of detecting whether the arrester is open, shorted, or normal and still connected to the winding before he energizes the transformer.

OBJECTS

An object of this invention is to provide, for evaluating the condition of such an arrester, a simple method which can be quickly and easily carried out by a lineman in the field with little risk of damaging a still-usable arrester or the associated transformer.

Another object is to provide a method for evaluating the condition of such an arrester which can be easily carried out in the field with relatively simple, inexpensive, and compact test apparatus.

Still another object is to provide simple, inexpensive, and compact test apparatus for evaluating the condition of such an arrester.

Still another object is to provide a method and test apparatus which readily lend themselves to the evaluation of externally-located arresters, as well as those located within the transformer tank.

SUMMARY

In the following summary and elsewhere throughout this specification, reference is made to the "breakdown voltage" of a lightning arrester. This term denotes the voltage on the volt-amp characteristic curve of the arrester at which the resistance of the arrester changes from substantially linear to very non-linear.

In carrying out the invention in one form, we provide, for evaluating the condition of a first lightning arrester of the gapless metal-oxide varistor type that is connected across the high voltage winding of a distribution transformer, a method that comprises the following steps:

(a) providing a second arrester of the gapless metal-oxide varistor type having means for changing its breakdown voltage between a first value that is higher than the normal breakdown voltage of the first arrestor and a second value that is lower than such normal breakdown voltage, (b) connecting said second arrester across the high voltage winding externally of the transformer housing and with its breakdown voltage set at said first value, (c) after step (b), applying to the external low voltage circuit of the transformer a first electric pulse that is transformed up by the transformer to a high voltage impulse (i) appearing across the high voltage winding and across the parallel combination of the two arrestors and (ii) capable of rising to a voltage at least as high as said first value unless limited by said first arrester, (d) determining whether the second arrester has conducted significant surge discharge current in response to the impression of said first impulse across the two arresters, (e) connecting said second arrester across the high voltage winding externally of the transformer housing and with its breakdown voltage set at said second value, (f) after step (e), applying to the external low voltage circuit of the transformer a second electric pulse that is transformed up by the transformer to a high voltage impulse (i) appearing across the high voltage winding and across the paralell combination of the two arresters and (ii) capable of rising to a voltage at least as high as said normal breakdown voltage of the first arrester unless limited by one of the arresters, and (g) determining whether the second arrester has conducted significant surge discharge current in response to the impression of said second impulse across the parallel combination of the two arresters.

By making the determinations defined in (d) and (g) above, it can be established whether the first arrester is in good condition, has failed in an open circuit condition, or has failed in a shorted condition. These determinations can be made either through visual observation of a suitable detector or by suitable conventional circuitry or the like.

BRIEF DESCRIPTION OF DRAWINGS

For a better understanding of the invention, reference may be had to the following description taken in connection with the accompanying drawings, wherein.

DETAILED DESCRIPTION OF PREFERRED EMBODIMENTS

Figure 1:
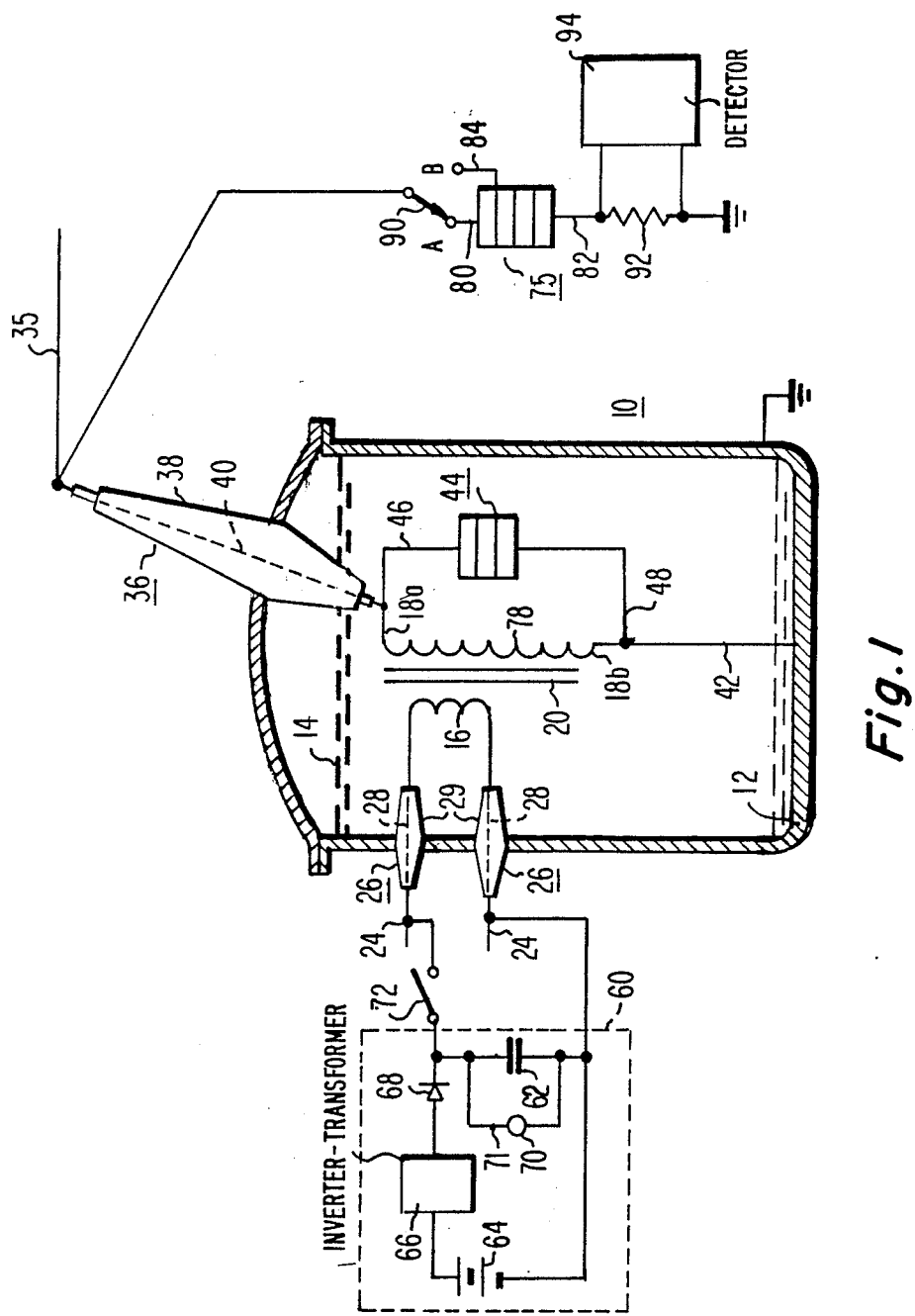
FIG. 1 is a schematic showing of our test apparatus being used for evaluating the condition of an arrester within a distribution transformer.

Referring now to FIG. 1, there is schematically shown a conventional distribution transformer 10 that comprises a grounded metal tank, or housing, 12 filled with oil 14. Within the tank and under oil are a low voltage winding 16, a high voltage winding 18, and a magnetizable core 20 for inductively coupling the windings 16 and 18 together.

The low voltage winding 16 is connected to an external low voltage circuit 24 by two low voltage bushings 26 extending through the tank wall. Each low voltage bushing comprises a conductive lead 28 and an insulating shell 29 surrounding the lead and insulating the lead from the grounded tank.

For interconnecting the high voltage winding 18 and an external high voltage circuit 35, a high voltage bushing 36 is provided. This bushing 36 comprises an insulating shell 38 extending through the cover portion of the tank and a conductive lead 40 extending through the shell and connected at its inner end to one terminal 18a of the high voltage winding 18.

The other terminal 18b of the high voltage winding 18 is connected to ground by a lead 42 between this terminal and the grounded tank.

For protecting the transformer windings against lightning surges, the transformer is provided with a lightning arrester 44 connected across its high voltage winding 18. This arrester 44 is located internally of the transformer tank 12 and under the insulating oil 14.

Figure 2:
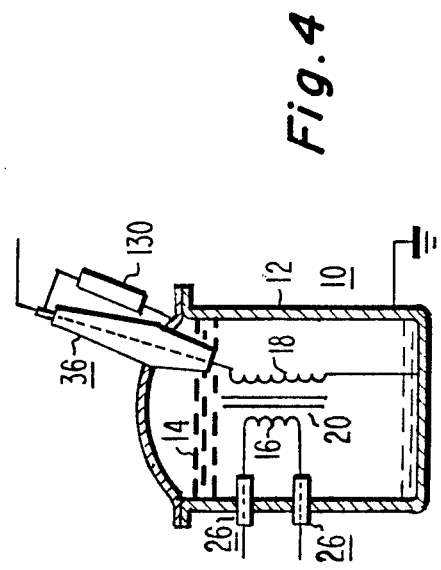
FIG. 2 is an enlarged cross-sectional view in simplified form showing the arrester under evaluation.

Referring to FIG. 2, the arrester 44 is of the gapless metal-oxide varistor type and is of a conventional design. In the illustrated example, it comprises a stack of metal-oxide varistor disks 50 electrically connected in series and located within a tubular insulating housing 54. Each disk includes on its upper and lower faces a conductive coating 51. The disks are spring biased together by a spring 53. The upper coating 51 of the upper disk is connected by a conductive lead 46 to the upper terminal 18a of high voltage winding 18, and the lower coating of the lower disk is connected by a conductive lead 48 to the lower terminal 18b of high voltage winding 18.

In accordance with conventional practice, the stack of metal-oxide varistors 50 is characterized by (i) a very high substantially linear resistance when the voltage thereacross is below a preselected multiple, e.g. 1.35, of normal voltage on the high voltage line 35 and (ii) by a lower and very non-linear resistance when the voltage thereacross equals or exceeds this multiple. When the voltage thereacross is in the normal range, no significant current flows through the arrester in view of its very resistance at such voltages. But, if there should appear at the terminal 18a of the high voltage winding 18 a surge, or impulse, that drives the voltage across the arrester to a value slightly exceeding the preselected multiple, the resistance of the varistor stack drops and becomes very non-linear, allowing surge discharge current to pass therethrough and limiting further increase in the voltage. The voltage at which the resistance changes from linear to very non-linear is referred to herein as the "breakdown voltage."

Immediately after the surge energy has thus been discharged and the voltage across the varistor stack returns to a normal range, the varistor stack returns to its essentially nonconducting state of high substantially linear resistance.

In the unlikely event that the arrester should fail there will usually be arcing within the insulating housing 54, and this builds up pressure which acts upon a frangible cap 56 suitably attached to lead 48 and housing 54. The pressure build-up will normally break the cap loose from the housing 54 and downwardly eject the cap and lead 48. This action will effectively disconnect the arrester from across the high voltage winding.

The above-described disconnection operation is not intended to interrupt current through the arrester in response to the fault therein. Such interruption (or clearing) is normally effected by a fuse or circuit breaker (not shown) in the supply circuit 35, which device opens in response to overcurrrent produced by the arrester thereby interrupting further current flow into the transformer through circuit 35. There is a possibility that the above-described arrester-disconnection operation will not have been completed when the fuse or circuit breaker opens, and this could result in a faulted (or shorted) arrester remaining connected to the high voltage winding. In any case, when a lineman arrives to service the transformer following opening of the above-described fuse or circuit breaker, it is desirable if he has a simple means of detecting whether the arrester is normal and still connected to the winding 18, is shorted and still connected to winding 18, or is open and disconnected from across winding 18.

We have provided simple and inexpensive apparatus for making this determination. This apparatus comprises a pulse power supply 60 for developing relatively low voltage pulses that are applied individually and at selected instances to the low voltage external circuit 24 at the terminals of low voltage leads 28. The pulse power supply 60 comprises a capacitor 62 which is charged to a suitable voltage, e.g., about 600 volts, by charging means comprising the series combination of a battery 64, an inverter-transformer combination 66, and a rectifier 68 connected across the capacitor 62. When the capacitor is charged to the desired voltage level, a READY light 70 connected in a shunt circuit 71 across the capacitor is lit. The lineman may then close a switch 72 which discharges the capacitor 62 via the low voltage bushing leads 28 through the low voltage winding 16 of the transformer.

The pulse applied to the low voltage leads is transformed up by the transformer windings to produce a high voltage impulse that appears across the high voltage winding 18 and specifically at the terminal 18a of the winding 18. This impulse is utilized in a manner soon to be described.

An additional component of the test apparatus is a test arrester 75 located externally of the tank 12 of the transformer. This arrester 75, like the arrester 44 being evaluated, is of the gapless metal-oxide varistor type. It comprises a stack of metal-oxide varistor disks of essentially the same construction as those of the first arrester 44 and connected in series between spaced-apart terminals 80 and 82. Intermediate to the terminals 80 and 82 there is a tap 84 connected between two of the disks. In one embodiment of the invention, the test arrester 75 includes 3½ metal-oxide disks, as compared to the 3 metal-oxide disks of the internal arrester 44. The three full disks in the test arrester are substantially identical to the three disks in the internal arrester. The one-half disk is substantially the same as the full disks but has a thickness one half of that of the full disks. The tap 84 is located between two of the full disks.

A two-position selector switch 90 is provided which is effective in one position (designated A) to connect the arrester terminal 80 to the high voltage external circuit 35 and is effective in its other position (designated B) to connect the tap 84 to the high voltage external circuit 35. When the switch 90 is connected in its A position, the test arrester has, in effect, 3½ disks in series and thus has a substantially higher breakdown voltage than the normal breakdown voltage of the internal arrester 44. When switch 90 is connected in its B position, i.e., to tap 84, the test arrester has, in effect, 2½ disks in series and thus has a substantially lower breakdown voltage than the normal breakdown voltage of the internal arrester 44.

Connected between the lower terminal 82 of the test arrester and ground is a linear resistance 92. Connected across this resistor 92 is a detector 94 which is capable of responding to the passage of significant current through resistor 92. In one embodiment of this invention, this detector 94 takes the form of a neon light which is turned on by the voltage developed across the resistor 92 when significant current flows therethrough. Suitable conventional means, e.g. a light-sensitive circuit that latches in an activated condition upon receiving an input from the neon light, is provided for recording turn-on of the neon light. This light-sensitive circuit is provided with manually operable means for deactivating, or resetting, it after it has been activated.

In another embodiment, the resistor 92 is located in the same housing 54 as the varistor disks 50.

When the test arrester 75 is in its normal, essentially non-conductive condition, no significant current flows therethrough, and the detector 94 remains deactivated. But when the test arrester 75 is caused to breakdown by a surge, or impulse, impressed thereacross, significant current, in the form of surge discharge current, flows through the series combination of arrester 75 and resistor 92, thus activating the detector 94, to provide an indication that the impulse has caused an operation of the arrester 75.

When a lineman wishes to evaluate the arrester 44 of the transformer after the high voltage circuit 35 has been opened by the above-described fuse or circuit breaker (not shown) in the line 35, he connects the pulse power supply 60 across the external terminals of the low voltage leads 28, as shown in FIG. 1. He also connects the test arrester 75 as shown in FIG. 1 to the external high voltage circuit 35, setting switch 90 in its position A, where the breakdown voltaeg of arrester 75 is higher than that of the internal arrester.

When the READY light 70 in the pulse power supply 60 indicates that the capacitor 62 is adequately charged, the lineman closes switch 72 to discharge the capacitor to apply the desired pulse to the low voltage winding 16. As previously pointed out, this pulse is transformed up by the transformer windings 16 and 18 and appears as a high voltage impulse across the high voltage winding 18. This impulse is also impressed across the parallel combination of arresters 44 and 75.

When the READY light 70 is lit at the time capacitor discharge switch 72 is closed, the pulse applied to the low voltage circuit will be of sufficient amplitude that the resulting impulse impressed across the parallel combination of the two arresters 44 and 75 would be capable of rising to a voltage at least as high as the breakdown voltage of the external arrester 75 unless such rise was limited by the internal arrester 44. If the internal arrester 44 is in its normal working condition at the time of this test, its breakdown voltage will be lower than that of the external arrester 75 when switch 90 is set as in position A. Accordingly, if internal arrester 44 is in its normal working condition, it will breakdown in response to this impulse, and substantially the entire surge current discharge will flow therethrough, with no significant current passing through the external arrester 75. Thus, the impulse applied under this conditions would produce no response by detector 94.

The detector 94 would likewise not respond to the impulse if, prior to the test, the internal arrester 44 had failed in a shorted (or closed) condition. The impulse impressed across the high voltage winding 18 would be shorted through the internal arrester 44, and no significant current would flow through the external arrester 75. Accordingly, the detector 94 would not respond to such impulse.

On the other hand, if the internal arrester, prior to the test had failed in its open position, the above-described impulse would cause a breakdown of the external arrester 75 instead of the internal arrester 44. Such breakdown would be recorded by the detector 94, responding to the surge discharge current through linear resistor 92.

To enable the test apparatus to distinguish between a condition where the internal arrester is in its normal working condition and a condition where it has failed in a shorted condition, another test is made, this one with the switch 90 set in position B and the pulse applied to the low voltage external circuit in the same manner as above described. If the internal arrester is in its normal working condition, the impulse appearing across the high voltage winding will cause a breakdown of the external arrester 75 since its breakdown voltage is set for this particular test to be lower than the normal breakdown voltage of the internal arrester 44. This breakdown will be recorded by the detector 94, responding to the flow of surge discharge current through resistor 92 upon breakdown of the external arrester.

If the internal arrester had been in a failed shorted condition at the time of this latter test, the discharge current of the impressed impulse would have flowed substantially entirely therethrough and no significant amount of such current would have passed through the external arrester. Thus, the detector 94 would not have responded to the impulse under these conditions.

The results of the above two tests can be more readily correlated by referring to the following logic table, where A represents a test made with the selector switch 90 in its position A (i.e., the high breakdown voltage position), and B represents a test made with selector switch 98 in its position B (i.e., the low breakdown voltage position).

| External Arrester Connection | Test Result: External Arrester Conduction | Significance of Test Result: Internal Arrester Condition |
| --- | --- | --- |
| A | NO | Good |
| B | YES | |
| A | NO | Bad (Short) |
| B | NO | |
| A | YES | Bad (Open) |
| B | YES | |

In the third column of this table, "Good" signifies that the internal arrester 44 is shown by the tests to be undamaged; "Bad (Short)" signifies that the internal arrester 44 is shown by the tests to have been damaged in a shorted mode; and "Bad (Open)" signifies that internal arrester 44 is shown by the tests to have been damaged in an open, or disconnected, mode.

The lineman who conducts these tests can keep a copy of this table and can refer to it after the two tests to establish what the condition of the internal arrester is.

Alternatively, a simple logic circuit (not shown) can be included as a part of or in association with the detector 94. This logic circuit will provide an appropriate output, based upon any combination of the above two YES or NO signals fed to it as inputs, indicating whether the internal arrester is in any one of the three conditions in the third column of the table.

It is to be noted that the power requirements for the above two tests are very low and can easily be supplied by a small self-contained battery (illustrated at 64 in FIG. 1). This results in exceptional compactness and a considerable cost and weight advantage, all of which are important for field test equipment to be carried in the lineman's truck. Another important advantage of this test equipment is that the above-described tests will not cause damage to the arrester 44 or to the associated transformer because the available power from the pulse source is too low to produce such damage and because the external arrester 75 provides overvoltage protection.

In one form of the invention, used for testing an arrester having a normal breakdown voltage of 27 KV in a distribution transformer having a rating of 15 KVA 34,500/19,920 V GRY-120/240 V, the capacitor in the pulse power supply has a capacitance of 28 microfarads and is charged to a voltage of 600 volts d.c. just prior to the time the test pulse is applied.

Figure 3:
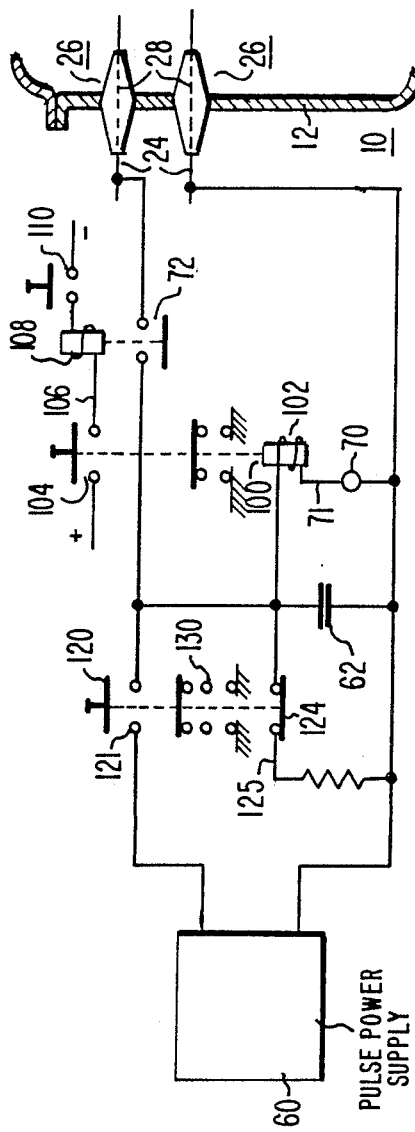
FIG. 3 is a schematic illustration of a modified form of the pulse-applying means used in carrying out the invention.

In one form of the invention, schematically illustrated in FIG. 3, interlock means is provided to assure that the test pulse is not applied until the capacitor 62 is charged to the required level. This interlock comprises an electromagnetic relay 100 having its coil 102 connected in series with the READY light 70 in the shunt circuit 71 across capacitor 62. Until the voltage across the capacitor 62 has reached the required level, no current flows through the coil 102 and the relay 100 remains inactive. When the voltage across capacitor 62 reaches the required level, the READY light 70 turns on, permitting a small amount of current to flow through shunt circuit 71 to energize the coil 102 of relay 100. Relay 100 responds by closing its contacts 104 connected in an energizing circuit 106 for the operating coil 108 of an electromagnetically operated switch 72 corresponding to the switch 72 of FIG. 1. With contacts 104 closed, actuation of the manual discharge-control switch 110 will complete the energizing circuit 106 and cause the switch 72 to close and discharge the capacitor 62 into the low voltage winding of the transformer, thus providing the desired test pulse.

It will be apparent that this arrangement renders the manual discharge-control switch 110 ineffective to produce discharge of the capacitor 62 until such time as the capacitor is charged to the desired voltage level.

As an added feature, we provide: (i) a manual charge-control switch 120 having contacts 121 through which the capacitor 62 is charged and (ii) means for assuring that the lineman is holding this switch 120 closed when he operates the capacitor discharge-control switch 110. The latter means comprises a set of normally closed contacts 124 connected in a low impedance discharge, or disabling, circuit 125 for the capacitor 62. It is only when the contacts 121 of switch 120 are closed and held closed that the contacts 124 can open to defeat the disabling circuit 125. If switch 120 is released, a spring 130 opens its contacts 121 and closes its contacts 124, thereby terminating capacitor charging and forcing the capacitor to discharge through the low impedance disabling circuit 125 without allowing a test pulse to be applied to the transformer. This arrangement requires the lineman to hold one hand on the capacitor charge-control switch 120 while he is operating the capacitor-discharge control switch 110.

These two switches 120 and 110 are physically located so far apart and so far from the transformer 10 that the lineman does not have a free hand during each test that could come near the high voltages developed by the test, thus providing a safety feature for the test equipment.

While the illustrated embodiment of the interlock circuit is electromechanical, it is to be understood that an equivalent electronic circuit, e.g., utilizing SCRs or the like, can instead be used.

Figure 4:
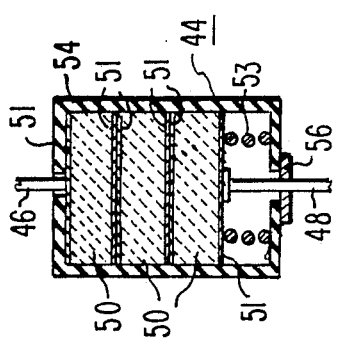
FIG. 4 shows a transformer with an externally-located arrester that can be evaluated with our method and test apparatus.

While the test equipment is especially useful in evaluating a lightning arrester that is located within the tank, or housing, of a transformer, it should be understood that it can also be used for evaluating an externally located arrester. FIG. 4 shows such an arrester at 130 connected across the external insulation of the high voltage bushing 36 of the transformer and between the high voltage external circuit 35 and the grounded tank 12 of the transformer. Evaluation of the arrester 130 is made with the same test equipment as described in connection with FIGS. 1 and 3. The pulse power source 60 and the test arrester 75 are connected to the transformer in the same manner as illustrated in FIG. 1, and the tests are conducted in the same manner as described in connection with FIG. 1.

It is to be understood that, as a general rule, for each rating of arrester that is to be evaluated, a different test arrester will be used. In any case, the test arrester (75) should have means for setting its breakover voltage at two different values, one higher and one lower than the normal breakover voltage of the arrester being evaluated.

While we have shown and described particular embodiments of our invention, it will be obvious to those skilled in the art that various changes and modifications may be made without departing from our invention in its broadest aspects; and we, therefore, intend herein to cover all such changes and modifications as fall within the true spirit and scope of our invention.

What we claim is:

1. A method of evaluating the condition of a first lightning arrester of the gapless metal-oxide varistor type that is connected across the high voltage winding of a distribution transformer that comprises: (i) a low voltage winding and a high voltage winding inductively coupled together, (ii) a housing in which said windings are located, (iii) a low voltage bushing including a low voltage lead for interconnecting an external low voltage circuit and one terminal of said low voltage winding, and (iv) a high voltage bushing including a high voltage lead for interconnecting an external high voltage circuit and one terminal of said high voltage winding, said method comprising the following steps:

(a) providing a second lightning arrester of the gapless metal-oxide varistor type having means for changing its breakdown voltage between a first value that is higher than the normal breakdown voltage of the first arrester and a second value that is lower than the normal breakdown voltage of the first arrester, (b) connecting said second arrester across said high voltage winding externally of said housing and with its breakdown voltage set at said first value, (c) after step (b), applying to said external low voltage circuit a first electric pulse that is transformed up by said windings to produce at said one terminal of said high voltage winding a first high voltage impulse that (i) is impressed across the parallel combination of said first and second arresters and (ii) is capable of rising to a voltage at least as high as said first value unless limited by said first arrester, (d) determining whether said second arrester has conducted significant surge discharge current in response to the impression of said first impulse across said two arresters, (e) connecting said second arrester across said high voltage winding externally of said housing and with its breakdown voltage set at said second value, (f) after step (e), applying to said external low voltage circuit a second electric pulse that is transformed up by said windings to produce at said one terminal of said high voltage winding a second impulse that (i) is impressed across the parallel combination of said first and second arresters and (ii) is capable of rising to a voltage at least as high as said normal breakdown voltage unless limited by one of said arresters, (g) determining whether said second arrester has conducted significant surge discharge current in response to the impression of said second impulse across said two arresters, and (h) utilizing the determinations of steps (d) and (g) to determine whether the first arrester then is undamaged, has been damaged in a shorted mode, or has been damaged in an open mode.

2. The method of claim 1 in which:

(a) said second arrester has two terminals and a tap intermediate to said terminals, (b) the breakdown voltage of the second arrester is set at said first value by connecting one of said arrester terminals to said external high voltage circuit and the other arrester terminal to ground, with said tap effectively disconnected, and (c) the breakdown voltage of the second arrester is set at said second value by connecting said tap and one of the arrester terminals between the external high voltage circuit and ground, with the other arrester terminal effectively disconnected.

3. The method of claim 1 in which said first arrester is located within said housing.

4. The method of claim 2 in which said first arrester is located within said housing.

5. The method of claim 1 in which said first arrester is located outside said housing.

6. The method of claim 2 in which said first arrester is located outside said housing.

7. A method of evaluating the condition of a first lightning arrester of the gapless metal-oxide varistor type that is connected across the high voltage winding of a distribution transformer that comprises: (i) a low voltage winding and a high voltage winding inductively coupled together, (ii) a housing in which said windings are located, (iii) a low voltage bushing including a low voltage lead for interconnecting an external low voltage circuit and one terminal of said low voltage winding, and (iv) a high voltage bushing including a high voltage lead for interconnecting an external high voltage circuit and one terminal of said high voltage winding, said method comprising the following steps:

(a) providing a second lightning arrester of the gapless metal-oxide varistor type having means for changing its breakdown voltage between a first value that is higher than the normal breakdown voltage of the first arrester and a second value that is lower than the normal breakdown voltage of the first arrester, (b) connecting said second arrester across said high voltage winding externally of said housing and with its breakdown voltage set at said first value, (c) after step (b), applying to said external low voltage circuit a first electric pulse that is transformed up by said windings to produce at said one terminal of said high voltage winding a first high voltage impulse that (i) is impressed across the parallel combination of said first and second arresters and (ii) is capable of rising to a voltage at least as high as said first value unless limited by said first arrester, (d) determining whether said second arrester has conducted significant surge discharge current in response to the impression of said first impulse across said two arresters, (e) connecting said second arrester across said high voltage winding externally of said housing and with its breakdown voltage set at said second value, (f) after step (e), applying to said external low voltage circuit a second electric pulse that is transformed up by said windings to produce at said one terminal of said high voltage winding a second impulse that (i) is impressed across the parallel combination of said first and second arresters and (ii) is capable of rising to a voltage at least as high as said normal breakdown voltage unless limited by one of said arresters, (g) determining whether said second arrester has conducted significant surge discharge current in response to the impression of said second impulse across said two arresters, and (h) determining the condition of said first arrester from the following logic, where A represents a test made using said first pulse and with the second arrester connected as in (b), and B represents a test made using said second pulse and with the second arrester connected as in (e):

| Second Arrester Connection | Test Result: Second Arrester Conduction | Significance of Test Result: First Arrester Condition |
|---|---|---|
| A | NO | Good |
| B | YES | |
| A | NO | Bad (Short) |
| B | NO | |
| A | YES | Bad (Open) |
| B | YES | | where Good signifies that the first arrester is shown by the tests to be undamaged, Bad (Short) signifies that the first arrester is shown by the tests to be damaged in a shorted mode, and Bad (Open) signifies that the first arrester is shown by the tests to be damaged in an open, or disconnected, mode.

8. Test apparatus for evaluating the condition of a first lightning arrester of the gapless metal-oxide varistor type that is connected across the high voltage winding of a distribution transformer that comprises: (i) a low voltage winding and a high voltage winding inductively coupled together, (ii) a housing in which said windings are located, (iii) a low voltage bushing including a low voltage lead for interconnecting an external low voltage circuit and one terminal of said low voltage winding, and (iv) a high voltage bushing including a high voltage lead for interconnecting an external high voltage circuit and one terminal of said high voltage winding, said test apparatus comprising:

(a) a second lightning arrester of the gapless metal-oxide varistor type having means for changing its breakdown voltage between a first value that is higher than the normal breakdown voltage of the first arrester and a second value that is lower than the normal breakdown voltage of the first arrester, (b) means for selectively connecting said second arrester across said high voltage winding externally of said transformer housing in each of the following two modes: (i) with its breakdown voltage set at said first value and (ii) with its breakdwon voltage set at said second value, (c) means for applying to said external low voltage circuit at different times first and second electric pulses that are each transformed by said windings to produce at said one terminal of said high voltage winding impulses that are each impressed across the parallel combination of said first and second arresters, the first impulse being impressed when said second arrester is connected as in mode (i) of paragraph (b) and being capable of rising to a voltage at least as high as said first value unless limited by said first arrester, the second impulse being impressed when said second arrester is connected as in mode (ii) of paragraph (b) and being capable of rising to at least said normal breakdown voltage of the first arrester unless limited by one of said arresters, (d) and means for determining whether said second arrester has conducted significant surge discharge currents in response to impression of each of said first and second impulses across said two arresters.

* * * * *